United States Patent
Lee et al.

(10) Patent No.: US 10,522,366 B2
(45) Date of Patent: Dec. 31, 2019

(54) METHOD OF FABRICATING SEMICONDUCTOR DEVICE

(71) Applicant: Samsung Electronics Co., Ltd., Suwon-si, Gyeonggi-do (KR)

(72) Inventors: Hyunchul Lee, Hwaseong-si (KR); Yunseung Kang, Seoul (KR); Sounghee Lee, Hwaseong-si (KR); Jiseung Lee, Seoul (KR); Sanggyo Chung, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/132,895

(22) Filed: Sep. 17, 2018

(65) Prior Publication Data
US 2019/0214273 A1 Jul. 11, 2019

(30) Foreign Application Priority Data
Jan. 10, 2018 (KR) .................. 10-2018-0003167

(51) Int. Cl.
| H01L 21/3213 | (2006.01) |
| H01L 21/033 | (2006.01) |
| H01L 21/308 | (2006.01) |
| H01L 21/311 | (2006.01) |

(52) U.S. Cl.
CPC .... *H01L 21/32139* (2013.01); *H01L 21/0337* (2013.01); *H01L 21/3086* (2013.01); *H01L 21/31116* (2013.01); *H01L 21/31144* (2013.01)

(58) Field of Classification Search
CPC ......... H01L 21/32139; H01L 21/31116; H01L 21/31144; H01L 21/0337; H01L 21/3086
See application file for complete search history.

(56) References Cited

U.S. PATENT DOCUMENTS

| 7,601,647 B2 | 10/2009 | Jeon et al. |
| 7,749,902 B2 | 7/2010 | Kim et al. |
| 8,551,888 B2 | 10/2013 | Kang et al. |
| 8,999,848 B2 | 4/2015 | Lee et al. |
| 9,082,829 B2 | 7/2015 | Wells |
| 9,123,659 B1 | 9/2015 | Fu et al. |
| 9,330,934 B2 | 5/2016 | Zhou et al. |
| 9,755,049 B2 | 9/2017 | Paak et al. |
| 9,837,273 B2 | 12/2017 | Lee et al. |
| 9,841,672 B2 | 12/2017 | Kang et al. |

(Continued)

FOREIGN PATENT DOCUMENTS

| KR | 1020160028781 A | 3/2016 |
| KR | 1020160090426 A | 8/2016 |

*Primary Examiner* — Duy Vu N Deo

(74) *Attorney, Agent, or Firm* — Myers Bigel, P.A.

(57) ABSTRACT

Disclosed is a method of fabricating a semiconductor device. The method includes forming a lower layer on a substrate, forming on the lower layer a sacrificial layer and an etching pattern, forming a first spacer layer on the sacrificial layer and the etching pattern, etching the sacrificial layer and the first spacer layer to form a sacrificial pattern and a first spacer on at least a portion of a top surface of the sacrificial pattern, forming a second spacer layer on the sacrificial pattern and the first spacer, etching the second spacer layer and the first spacer to form a second spacer on a sidewall of the sacrificial pattern, and partially etching the lower layer to form a pattern. The second spacer is used as an etching mask to partially etch the lower layer.

20 Claims, 13 Drawing Sheets

(56) References Cited

U.S. PATENT DOCUMENTS

2013/0122686 A1* 5/2013 Chang ............... H01L 21/02639
438/429
2014/0024209 A1* 1/2014 Jung ............... H01L 21/823456
438/595
2016/0343861 A1* 11/2016 Doris ................ H01L 29/66795

* cited by examiner

METHOD OF FABRICATING SEMICONDUCTOR DEVICE

CROSS-REFERENCE TO RELATED APPLICATIONS

This U.S. non-provisional application claims priority under 35 U.S.C § 119 to Korean Patent Application No. 10-2018-0003167 filed on Jan. 10, 2018, in the Korean Intellectual Property Office, the contents of which are hereby incorporated in their entirety by reference.

BACKGROUND

Inventive concepts relate to a method of fabricating a semiconductor device, and more particularly, to a simplified method of fabricating a semiconductor device.

Semiconductor devices have an important role in the electronics industry because of their small size, multi-functionality, and/or low fabrication cost. Semiconductor devices may encompass semiconductor memory devices storing logic data, semiconductor logic devices processing operations of logic data, and/or hybrid semiconductor devices having both memory and logic elements. Semiconductor devices have been increasingly fabricated with higher integration with the advanced development of the electronics industry. For example, semiconductor devices have been increasingly requested for high reliability, high speed, and/or multi-functionality. Semiconductor devices have become more complicated and more integrated to meet these requested characteristics.

SUMMARY

Some embodiments of inventive concepts provide a simplified method of fabricating a semiconductor device.

An object of inventive concepts is not limited to the mentioned above, and other objects which have not been mentioned above will be clearly understood to those skilled in the art from the following description.

According to some embodiments of inventive concepts, a method of fabricating a semiconductor device may include forming a lower layer on a substrate, and forming on the lower layer a sacrificial layer and an etching pattern. The sacrificial layer includes a protrusion that protrudes from a top surface of the sacrificial layer, and the etching pattern is on the protrusion. They method includes forming a first spacer layer on the sacrificial layer and the etching pattern, etching the sacrificial layer and the first spacer layer to form a sacrificial pattern and a first spacer on at least a portion of a top surface of the sacrificial pattern, forming a second spacer layer on the sacrificial pattern and the first spacer, and etching the second spacer layer and the first spacer to form a second spacer on a sidewall of the sacrificial pattern. The second spacer layer and the first spacer are etched until the top surface of the sacrificial pattern is exposed. The method includes partially etching the lower layer to form a pattern. The second spacer is used as an etching mask to partially etch the lower layer.

According to some embodiments of inventive concepts, a method of fabricating a semiconductor device may include forming a sacrificial layer, a first etching pattern, and a second etching pattern on a substrate including a first region and a second region. The sacrificial layer may include a first protrusion that is on the first region and protrudes from a top surface of the sacrificial layer, and a second protrusion that is on the second region, the first etching pattern being on the first protrusion and the second etching pattern being on the second protrusion. The method includes forming a first spacer layer on the sacrificial layer, the first etching pattern, and the second etching pattern, and etching the first spacer layer and the sacrificial layer to form a first sacrificial pattern and a first spacer on the first region of the substrate and to form a second sacrificial pattern and a second spacer on the second region of the substrate. The first etching pattern may remain on a top surface of the first sacrificial pattern. The second spacer may be formed on a top surface of the second sacrificial pattern. The top surface of the first etching pattern may be located at a different level from that of a top surface of the second spacer.

According to some embodiments of inventive concepts, a method of fabricating a semiconductor device may include forming a sacrificial layer, a first etching pattern, and a second etching pattern on a substrate including a first region and a second region. The sacrificial layer may include a first protrusion that is on the first region and protrudes from a top surface of the sacrificial layer, and a second protrusion that is on the second region, the first etching pattern being on the first protrusion and the second etching pattern being on the second protrusion. The method includes forming a first spacer layer on the sacrificial layer, the first etching pattern, and the second etching pattern, and etching the first spacer layer and the sacrificial layer to form a first sacrificial pattern and a first spacer on the first region of the substrate and to form a second sacrificial pattern and a second spacer on the second region of the substrate. The first spacer may be formed on a lateral surface of the first sacrificial pattern. The second spacer may be formed on a top surface of the second sacrificial pattern.

BRIEF DESCRIPTION OF THE DRAWINGS

FIGS. 2A to 4A illustrate plan views of a portion of a second region in a substrate, showing a method of fabricating a semiconductor device according to example embodiments of the present inventive concept.

FIGS. 2B to 4B, 5, and 6 illustrate cross-sectional views showing methods of fabricating a semiconductor device according to example embodiments of the present inventive concept.

DETAILED DESCRIPTION

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are, explained in detail in the specification set forth below.

FIGS. 1A to 1H illustrate cross-sectional views showing a method of fabricating a semiconductor device according to some embodiments of inventive concepts.

Figure 1A:
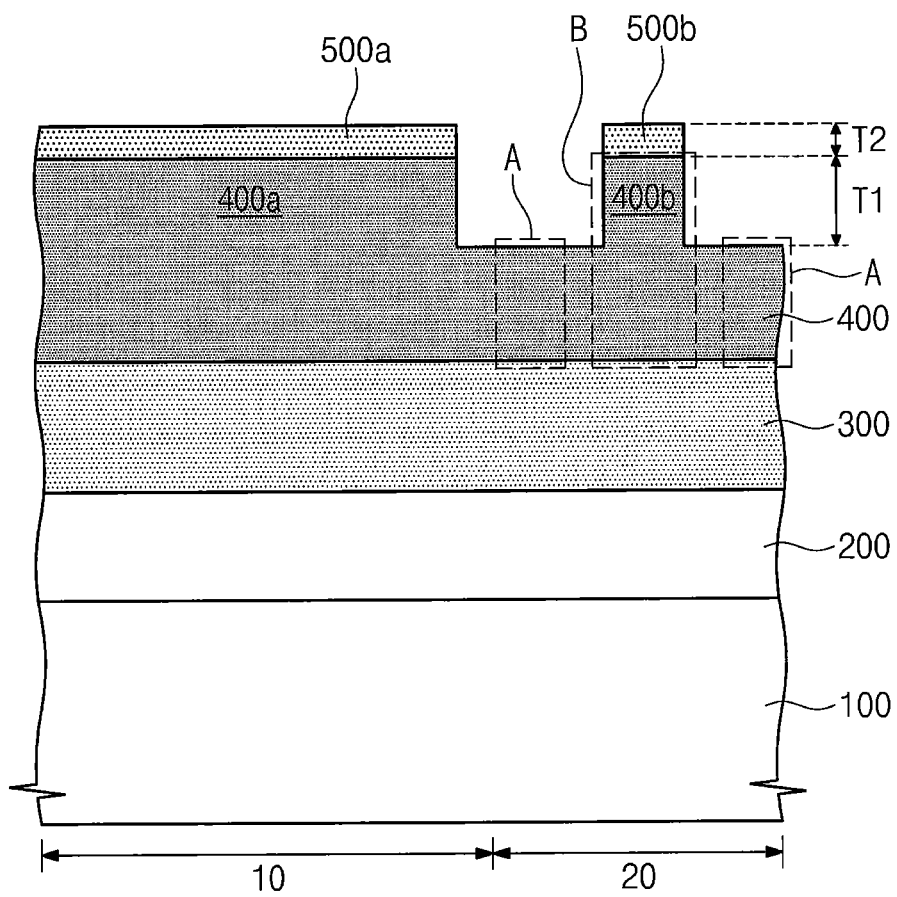
FIGS. 1A to 1H illustrate cross-sectional views showing a method of fabricating a semiconductor device according to example embodiments of the present inventive concept.

Referring to FIG. 1A, a first layer 200 and a second layer 300 may be sequentially formed on a substrate 100. The substrate 100 may include a first region 10 and a second region 20. For example, the first region 10 may be a peripheral circuit zone, and the second region 20 may be a cell zone. The first region 10 of the substrate 100 may be provided with align keys and/or transistors that drive semiconductor memory devices, and the second region 20 of the substrate 100 may be provided with semiconductor memory devices that store data. The substrate 100 may be, for example, a bulk silicon substrate, a silicon-on-insulator (SOI) substrate, a germanium substrate, a germanium-on-insulator (GOI) substrate, a silicon-germanium substrate, or an epitaxial layer substrate obtained by performing selective epitaxial growth (SEG). It will be understood that, although the terms first, second, third, etc. may be used herein to describe various elements, elements should not be limited by these terms; rather, these terms are only used to distinguish one element from another element. Thus, a first element discussed below could be termed a second element without departing from the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

One of the first and second layers 200 and 300 may be called a lower layer. The first layer 200 may include a material exhibiting etch selectivity to the substrate 100. The first layer 200 may include, for example, one or more of a silicon oxide layer and a thermal oxide layer. The second layer 300 may include a material exhibiting etch selectivity to the first layer 200. The second layer 300 may include, for example, polysilicon or metal.

A sacrificial layer 400, a first etching pattern 500*a*, and a second etching pattern 500*b* may be formed on the second layer 300. The sacrificial layer 400 may include a first protrusion 400*a* and a second protrusion 400*b* that protrude from a top surface of the second layer 400. The first protrusion 400*a* may be disposed on the first region 10 of the substrate 100, and the second protrusion 400*b* may be disposed on the second region 20 of the substrate 100. The first etching pattern 500*a* may be disposed on a top surface of the first protrusion 400*a*, and the second etching pattern 500*b* may be disposed on a top surface of the second protrusion 400*b*.

The formation of the sacrificial layer 400, the first etching pattern 500*a*, and the second etching pattern 500*b* may include sequentially forming the sacrificial layer 400, a third layer (not shown), and a mask pattern (not shown) on the second layer 300, and then using the mask pattern as an etching mask to sequentially etch the third layer and the sacrificial layer 400. The first and second etching patterns 500*a* and 500*b* may be formed when the third layer exposed through the mask pattern is etched until the top surface of the sacrificial layer 400 is exposed, and the first and second protrusions 400*a* and 400*b* may be formed when the sacrificial layer 400 is etched on its upper portion exposed through the first and second etching patterns 500*a* and 500*b*. In the figures, only one first protrusion 400*a* is illustrated, but a plurality of first protrusions 400*a* may be provided. The same holds true of the second protrusion 400*b*.

Each of the first and second protrusions 400*a* and 400*b* may have a first thickness T1 ranging from about 200 Å to about 600 Å. For example, the first thickness T1 may indicate a thickness between the top surface of each of the first and second protrusions 400*a* and 400*b* and the top surface of the sacrificial layer 400 that is exposed between the first and second protrusions 400*a* and 400*b*. The first thickness T1 may affect a subsequent etching process. This will be further discussed in detail with reference to FIG. 1B. Each of the first and second etching patterns 500*a* and 500*b* may have a second thickness T2 that is determined in consideration of a difference in time required for etching A and B segments of the sacrificial layer 400 in a subsequent etching process. The A segment may be disposed between top and bottom surfaces of the sacrificial layer 400, which top surface is exposed through or between the first and second protrusions 500*a* and 500*b*. The B segment may be disposed between the bottom surface of the sacrificial layer 400 and a bottom surface of the second protrusion 400*b*. For example, an increase in the second thickness T2 may result in more time required to etch the second etching pattern 500*b*, which situation may in turn result in more time required to etch the B segment. For this reason, an increase in the second thickness T2 may expand a difference in time between when the etching of the A segment is finished and when the etching of the B segment is finished. For example, the second thickness T2 may fall within a range from about 150 Å to about 300 Å.

The sacrificial layer 400 may include a material exhibiting etch selectivity to the second layer 300. The sacrificial layer 400 may be formed of a carbon-based material. For example, the sacrificial layer 400 may be or include a spin-on-hardmask (SOH) layer or an amorphous carbon layer (ACL). The first and second etching patterns 500*a* and 500*b* may include a material exhibiting etch selectivity to the sacrificial layer 400. For example, the first and second etching patterns 500*a* and 500*b* may include SiON.

Figure 1B:
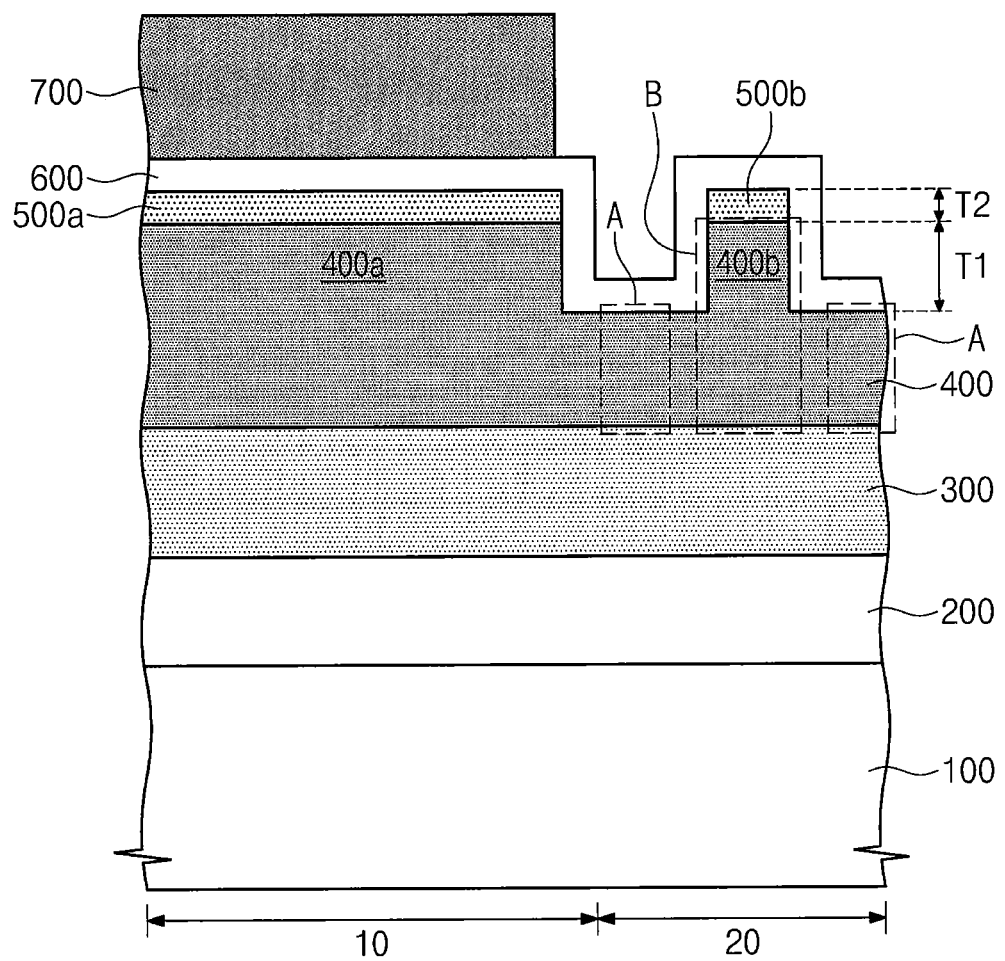

Referring to FIG. 1B, a first spacer layer 600 may be formed on or to conformally cover the sacrificial layer 400, the first etching pattern 500*a*, and the second etching pattern 500*b*. The first spacer layer 600 may be formed by, for example, atomic layer deposition (ALD). The first spacer layer 600 may include, for example, a silicon oxide layer.

The first spacer layer 600 may have a height covering a sidewall of the first protrusion 400*a* and/or on sidewalls of the second protrusion 400*b*, which height may be determined by the first thickness T1. For example, an increase in the first thickness T1 may cause the first spacer layer 600 to have an increased height covering the sidewall of the first protrusion 400*a* and the sidewalls of the second protrusion 400*b*. In an etching process which will be discussed below with reference to FIG. 1C, the first spacer layer 600 on or covering the sidewalls of the first and second protrusions 400*a* and 400*b* may be used as an etching mask to etch the sacrificial layer 400, and therefore the first thickness T1 may be controlled based on an etching amount of the sacrificial layer 400. For example, when the sacrificial layer 400 is required to be etched in a large amount, it may be necessary that the first spacer layer 600 have an increased height covering the sidewall of the first protrusion 400*a* and the sidewalls of the second protrusion 400*b*. The height of the first spacer layer 600 may correspond to the first thickness T1.

A mask pattern 700 may be formed on the first protrusion 400*a*. The mask pattern 700 may be on or cover the first spacer layer 600 formed on the first region 10 of the substrate 100, and expose the first spacer layer 600 formed on the second region 20 of the substrate 100 and may be on or covering the sidewall of the first protrusion 400*a*. The mask pattern 700 may be, for example, a photoresist pattern.

Figure 1C:
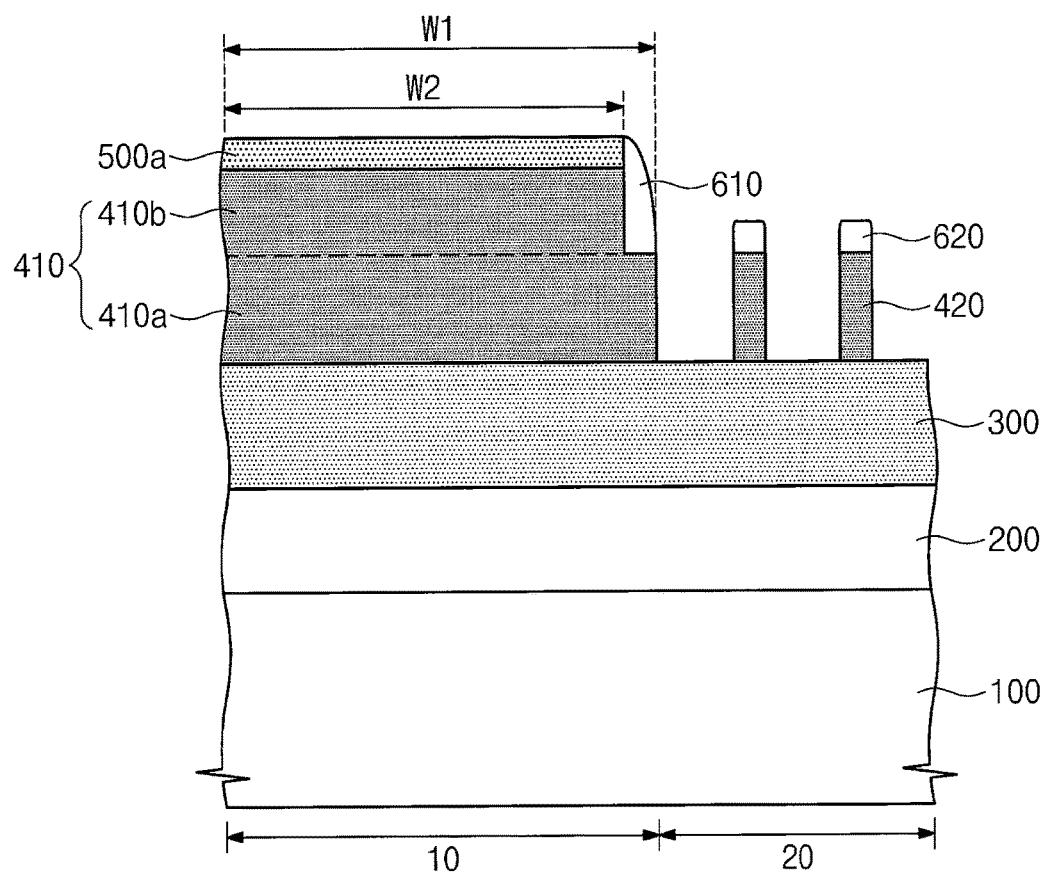

Referring to FIG. 1C, the mask pattern 700 may be used as an etching mask in an etching process that etches the first spacer layer 600 and the sacrificial layer 400. Therefore, a first sacrificial pattern 410 and a first spacer 610 on a lateral or side surface of the first sacrificial pattern 410 may be formed on the first region 10 of the substrate 100, and second sacrificial patterns 420 and second spacers 620 on top surfaces of the second sacrificial patterns 420 may be formed on the second region 20 of the substrate 100. The sacrificial layer 400 may be etched to form the first sacrificial pattern 410 and the second sacrificial patterns 420, and the first spacer layer 600 may be etched to form the first spacer 610 and the second spacers 620. The second layer 300 may be partially exposed on its top surface between the first sacrificial pattern 410 and the second sacrificial pattern 420 and between neighboring second sacrificial patterns 420.

The etching process may etch the first spacer layer 600 so as to expose a top surface of the second etching pattern 500b and the top surface of the sacrificial layer 400 between the first and second etching patterns 500a and 500b, thereby forming the first spacer 610 and the second spacers 620. The first spacer 610 may be formed to cover or be on the sidewall of the first protrusion 400a and lateral/side and top surfaces of the first etching pattern 500a, and the second spacers 620 may be formed to at least partially cover the sidewalls of the second protrusion 400b and lateral or side surfaces of the second etching pattern 500b.

The second etching pattern 500b and the sacrificial layer 400 that are exposed through the first and second spacers 610 and 620 may be sequentially etched to expose the top surface of the second layer 300, which step may form the first sacrificial pattern 410 and the second sacrificial patterns 420. The second etching pattern 500b and the mask pattern 700 may be simultaneously etched and removed during the etching process. The etching process may also etch and remove the first spacer 610 formed on the top surface of the first etching pattern 500a, which first spacer 610 is exposed due to the removal of the mask pattern 700, thereby exposing the top surface of the first etching pattern 500a. After the etching process, the first etching pattern 500a may remain on a top surface of the first sacrificial pattern 410.

The first etching pattern 500a on the top surface of the first sacrificial pattern 410 may have its top surface at a different level from those of top surfaces of the second spacers 620 on the top surfaces of the second sacrificial patterns 420. For example, the top surface of the first etching pattern 500a may be located at a higher level than those of the top surfaces of the second spacers 620.

The first sacrificial pattern 410 may be formed to have substantially the same width as a sum of a width of the first protrusion 400a and a thickness of the first spacer layer 600 on the sidewall of the first protrusion 400a. The second sacrificial patterns 420 may each be formed to have substantially the same width as a thickness of the first spacer layer 600 on the sidewalls of the second protrusion 400b. The second sacrificial patterns 420 may each have substantially the same thickness as that of the A segment (see FIG. 1B) between the top and bottom surfaces of the sacrificial layer 400, which top surface is exposed through the first and second etching patterns 500a and 500b.

As discussed above, since the A and B segments of the sacrificial layer 400 have different thicknesses, the A segment may differ from the B segment in terms of required etching time. For example, the B segment between the top surface of the second protrusion 400b and the bottom surface of the sacrificial layer 400 may require an etching time greater than that of the A segment between the top and bottom surfaces of the sacrificial layer 400, which top surface of the sacrificial layer 400 is exposed through the first and second etching patterns 500a and 500b. Since the etching time of the sacrificial layer 400 is different based on its position and thickness, the second sacrificial patterns 420 may be formed to have irregular widths, and the lateral or side surfaces of the first and second sacrificial patterns 410 and 420 may not be etched vertically to a top surface of the substrate 100. In order that the lateral or side surfaces of the first and second sacrificial patterns 410 and 420 are formed vertically to the top surface of the substrate 100, the sacrificial layer 400 may be etched in an atmosphere of COS, $O_2$, He, and/or Ar under a low pressure of about 5 mTorr to about 20 mTorr at a high voltage of about 150 V to about 700 V.

The first sacrificial pattern 410 may include a first segment 410a and a second segment 410b on the first segment 410a. The first segment 410a may have a width W1 greater than a width W2 of the second segment 410b. The second segment 410b may then partially expose a top surface of the first segment 410a. The first spacer 610 may be disposed on the exposed top surface of the first segment 410a, while covering lateral or side surfaces of the second segment 401b and the first etching pattern 500a. The first spacer 610 may not be on or cover a lateral or side surface of the first segment 410a. The top surfaces of the second sacrificial patterns 420 may be located at a level the same as that of the top surface of the first segment 401a and lower than that of a top surface of the second segment 410b.

Figure 1D:
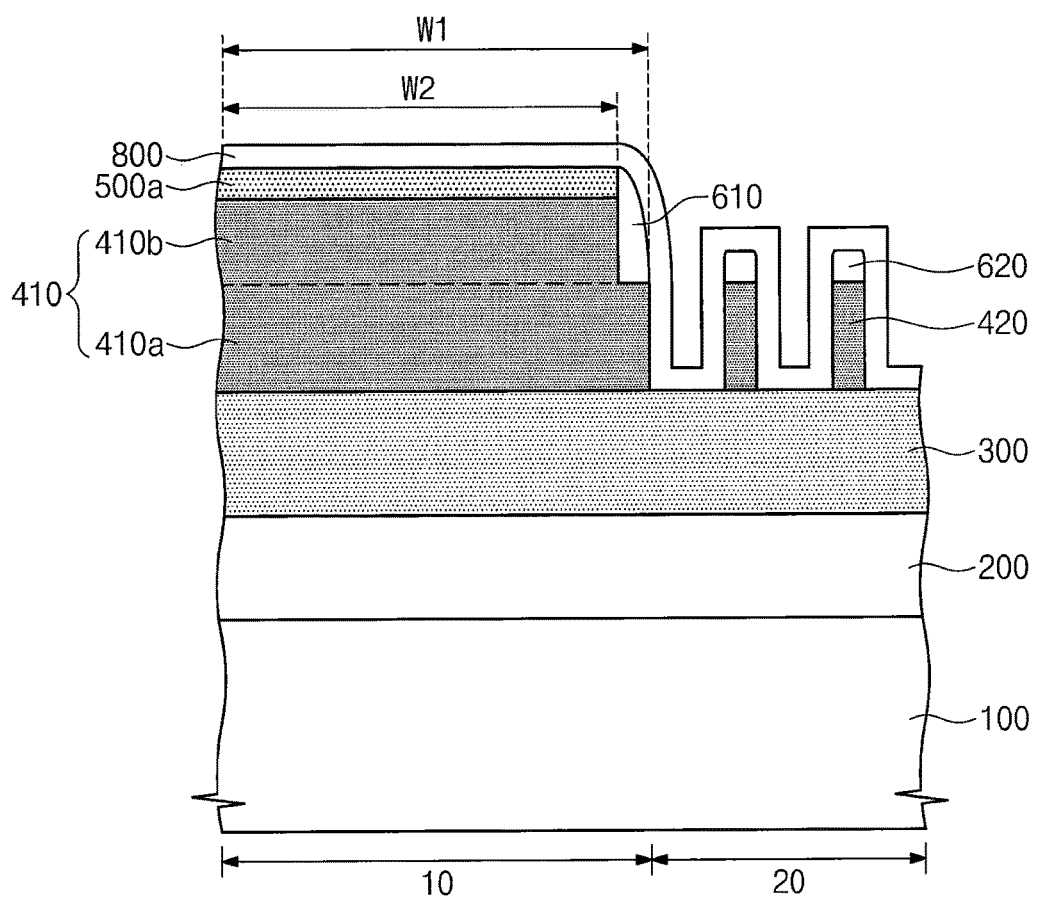

Referring to FIG. 1D, a second spacer layer 800 may be formed on or to conformally cover the first etching pattern 500a, the first sacrificial pattern 410, the first spacer 610, the second spacers 620, the second sacrificial patterns 420, and portions of the top surface of the second layer 300. In some embodiments, the second spacer layer 800 may have a thickness covering the lateral or side surfaces of the first and second sacrificial patterns 410 and 420, which thickness may correspond to a width of a target pattern or line. The second spacer layer 800 may be formed by atomic layer deposition (ALD). The second spacer layer 800 may include, for example, a silicon oxide layer.

Figure 1E:
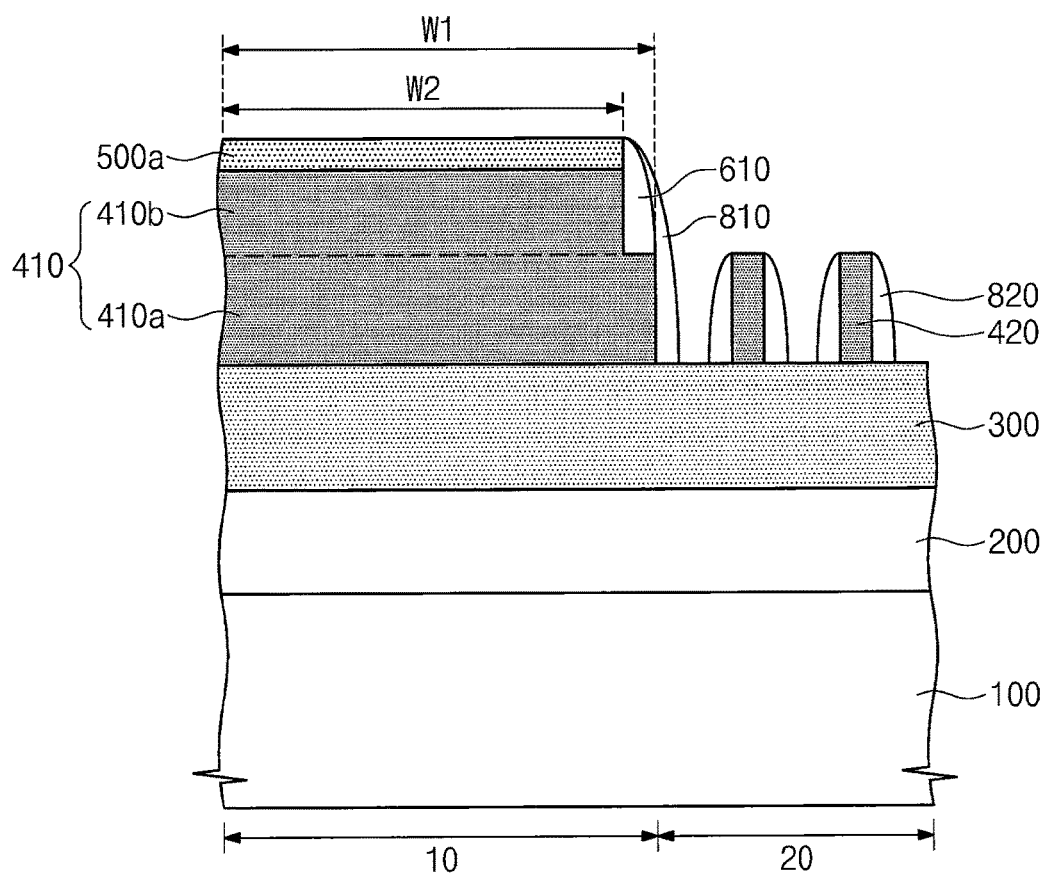

Referring to FIG. 1E, the second spacer layer 800 may experience an etching process to form a third spacer 810 and fourth spacers 820. The etching process may continue until the top surfaces of the second sacrificial patterns 420 are exposed. The etching process may expose the top surface of the first etching pattern 500a, the top surfaces of the second sacrificial patterns 420, and portions of the top surface of the second layer 300. The third spacer 810 may be formed on a sidewall of the first spacer 610 and the lateral or side surface of the first segment 410a of the first sacrificial pattern 410. The fourth spacers 820 may be formed on the lateral or side surfaces of the second sacrificial patterns 420. The etching process may be an anisotropic etching process. The anisotropic etching process may use an etchant in which a main gas such as CxFy or CHxFy is mixed with one or more of $O_2$ and Ar.

Figure 1F:
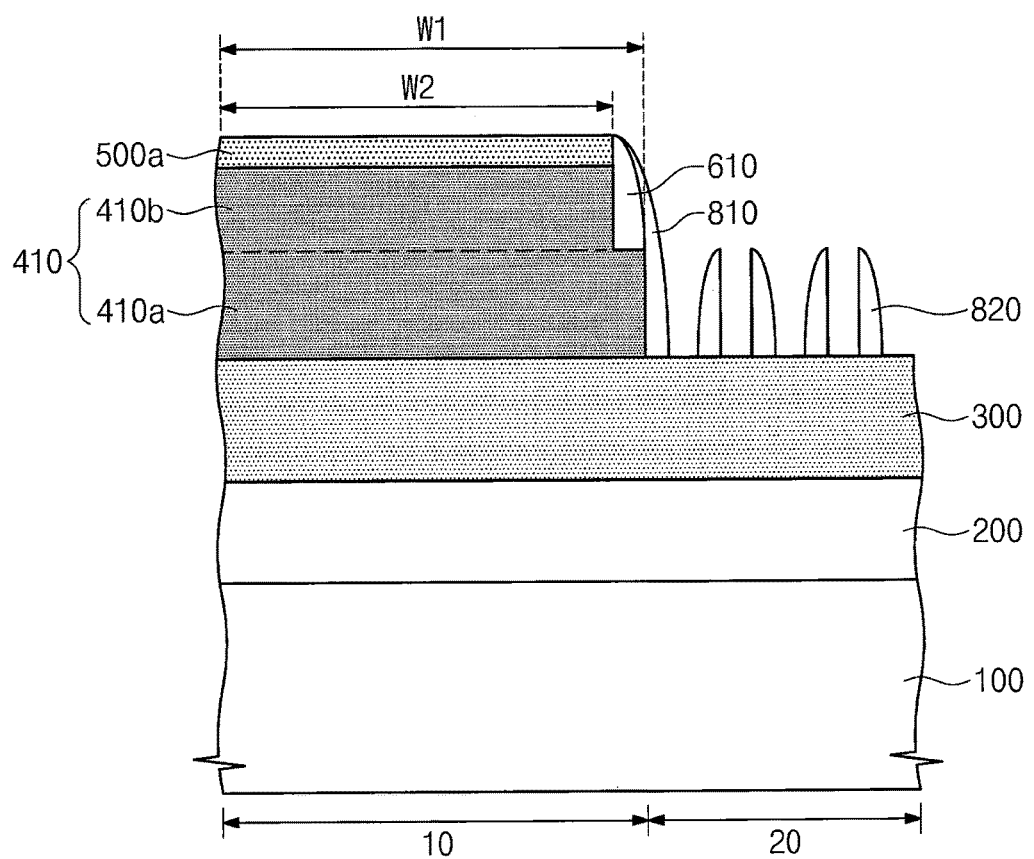

Referring to FIG. 1F, the second sacrificial patterns 420 may be removed. The removal of the second sacrificial patterns 420 may expose portions of the top surface of the second layer 300 that are on or covered with the second sacrificial patterns 420 and also expose inner sidewalls of the fourth spacers 820. The first etching pattern 500a, the first spacer 610, the third spacer 810, the fourth spacers 820, and the second layer 300 may include materials exhibiting etch selectivity to the second sacrificial patterns 420, and thus may not be etched during the removal of the second sacrificial patterns 420. Even though the first sacrificial pattern 410 includes the same material as those of the second sacrificial patterns 420, the first sacrificial pattern 410 may not be etched during the removal of the second sacrificial patterns 420 because the first sacrificial pattern 410 is on or covered with the first etching pattern 500a, the first spacer 610, and the third spacer 810. The second sacrificial patterns 420 may be removed by, for example, a dry etching process or an ashing process. The third spacer 810 may extend to and contact with the second layer 300.

Figure 1G:
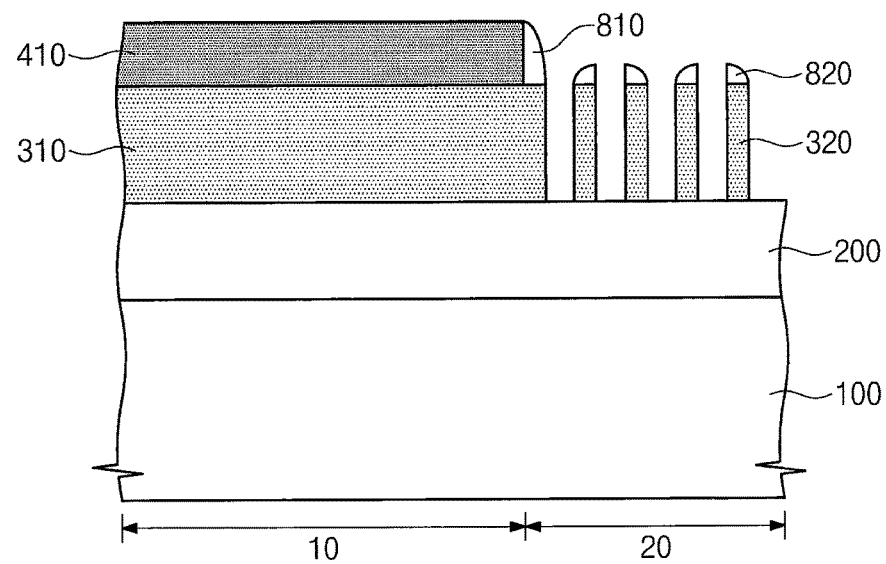

Referring to FIG. 1G, the second layer 300 may be partially etched to form a first pattern 310 and second patterns 320. For example, an etching process may be performed on the second layer 300 exposed through the first etching pattern 500a, the first sacrificial pattern 410, the first spacer 610, the third spacer 810, and the fourth spacers 820, thereby forming the first pattern 310 and the second patterns 320. The first pattern 310 may be formed on the first region 10 of the substrate 100, and the second patterns 320 may be formed on the second region 20 of the substrate 100. The first pattern 310 may be formed to have the same width as a sum of the width (W1 of FIG. 1F) of the first segment 410a of the first sacrificial pattern 410 and a width of a bottom surface of the third spacer 810, which bottom surface is in contact with the second layer 300. The second pattern 320 may be formed to have the same width as that of a bottom surface of the fourth spacer 820, which bottom surface is in contact with the second layer 300.

The etching process may remove the first etching pattern 500a and the first spacer 610. The first pattern 310 may still be provided thereon with the first sacrificial pattern 410 and the third spacer 810 whose thicknesses are reduced by the etching process. The second patterns 320 may still be provided thereon with the fourth spacers 820 whose thicknesses are reduced by the etching process. For example, the third spacer 810 may have a height greater than those of the fourth spacers 820. The etching process may be a dry etching process.

Figure 1H:
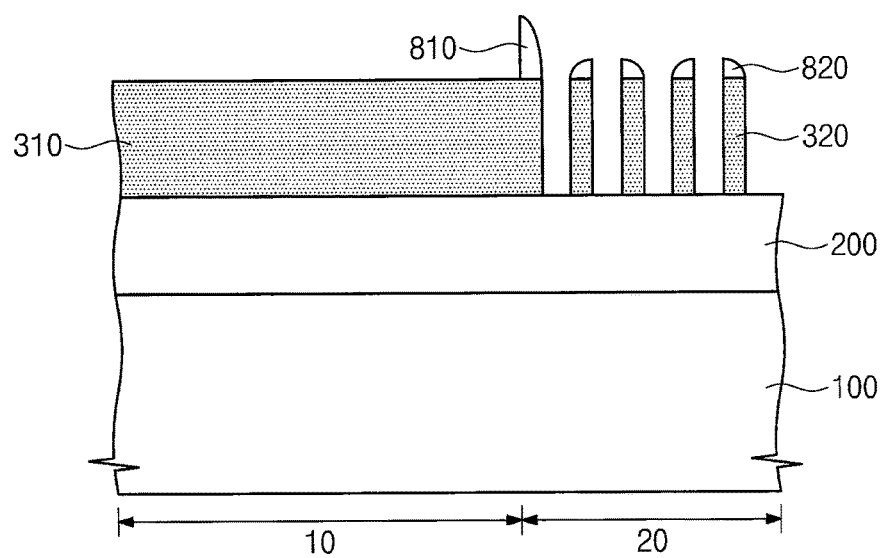

Referring to FIG. 1H, the first sacrificial patterns 410 may be removed. The first pattern 310, the second patterns 320, the third spacer 810, and the fourth spacers 820 may include materials exhibiting etch selectivity to the first sacrificial pattern 410, and thus may not be removed together with the first sacrificial pattern 410. The first sacrificial pattern 410 may be removed by, for example, a dry etching process or an ashing process.

Double patterning technology is a technique used to form a pattern at an exposable minimum pitch achieved by an exposure apparatus without changing the exposure apparatus. For example, the formation of fine patterns uses the double patterning technology by which spacers are formed on sidewalls of a sacrificial pattern formed by a photolithography process, the sacrificial pattern is removed, and then only the spacers are used as an etching mask to etch an etching target. As semiconductor devices increase in integration, there is an increasing demand for advanced technology capable of forming much finer patterns. According to some embodiments of inventive concepts, one sacrificial layer 400 may be used to perform a double patterning process twice, and thus manufacturing processes may become more simplified.

In some embodiments, the first and second patterns 310 and 320 may be formed to have their widths corresponding to those of patterns or lines that are what fabrication methods of inventive concepts intend to obtain. The following description with reference to the drawings relates to a formation of active patterns in memory devices by employing a fabrication method of inventive concepts.

Figure 2A:
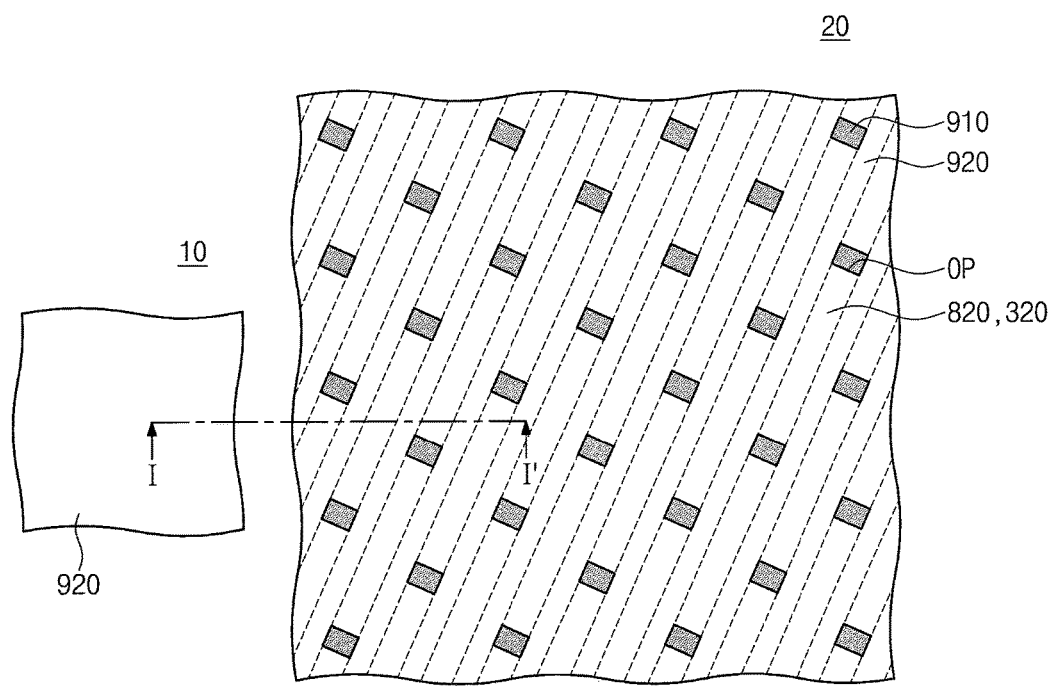
Figure 2B:
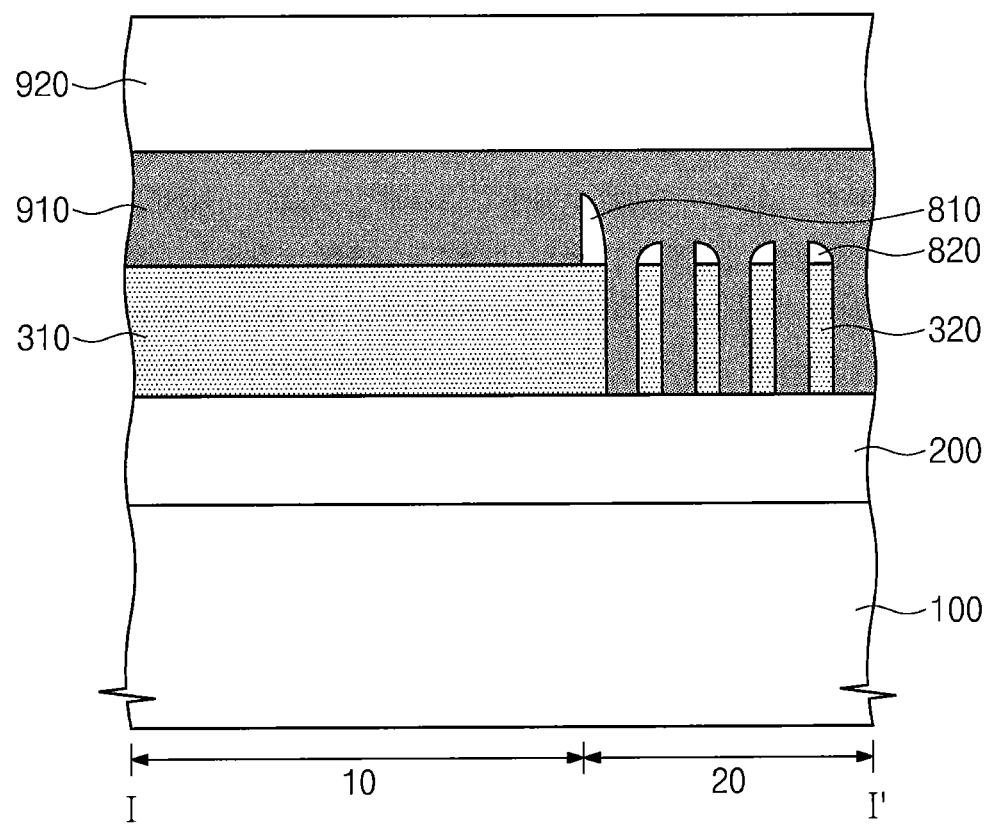
Figure 3A:
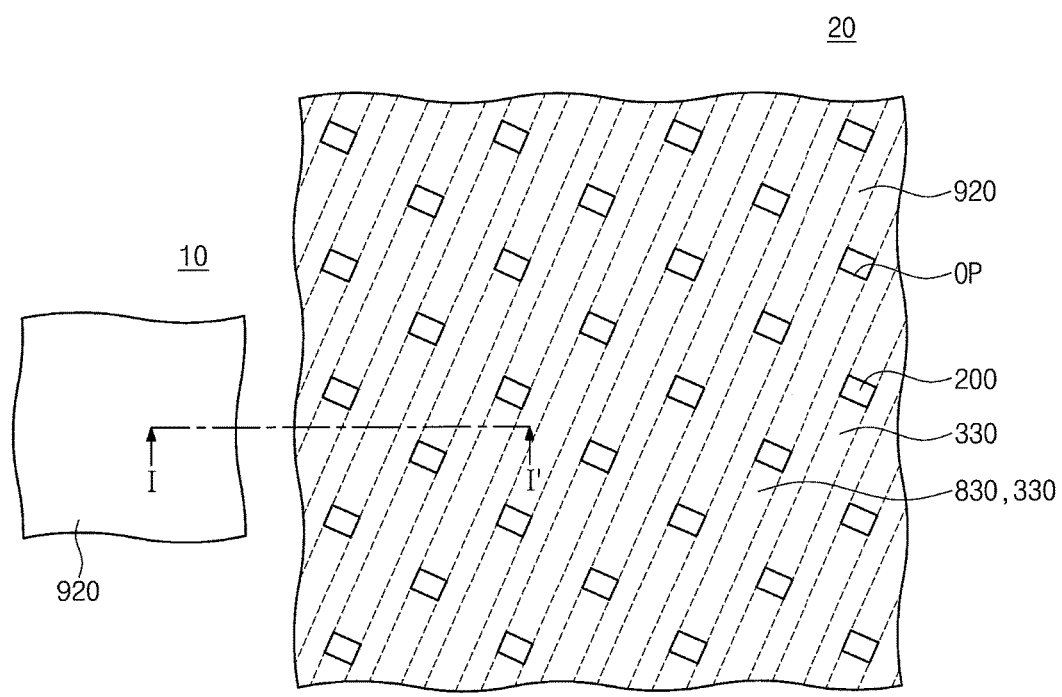
Figure 3B:
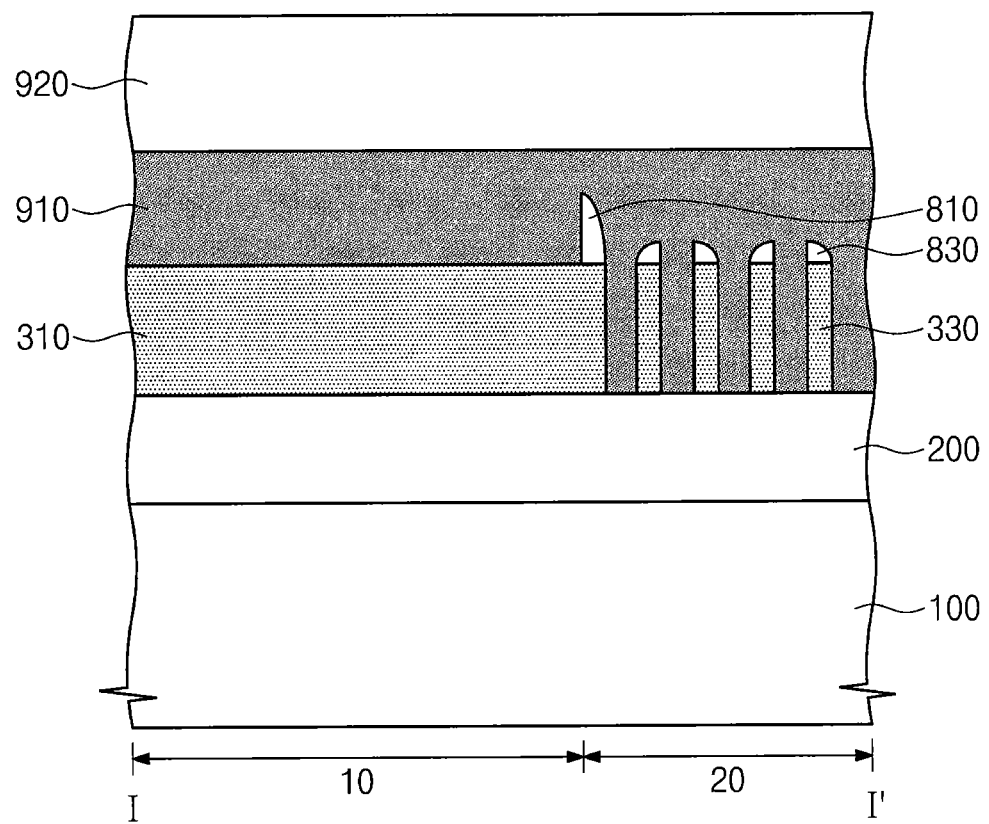
Figure 4A:
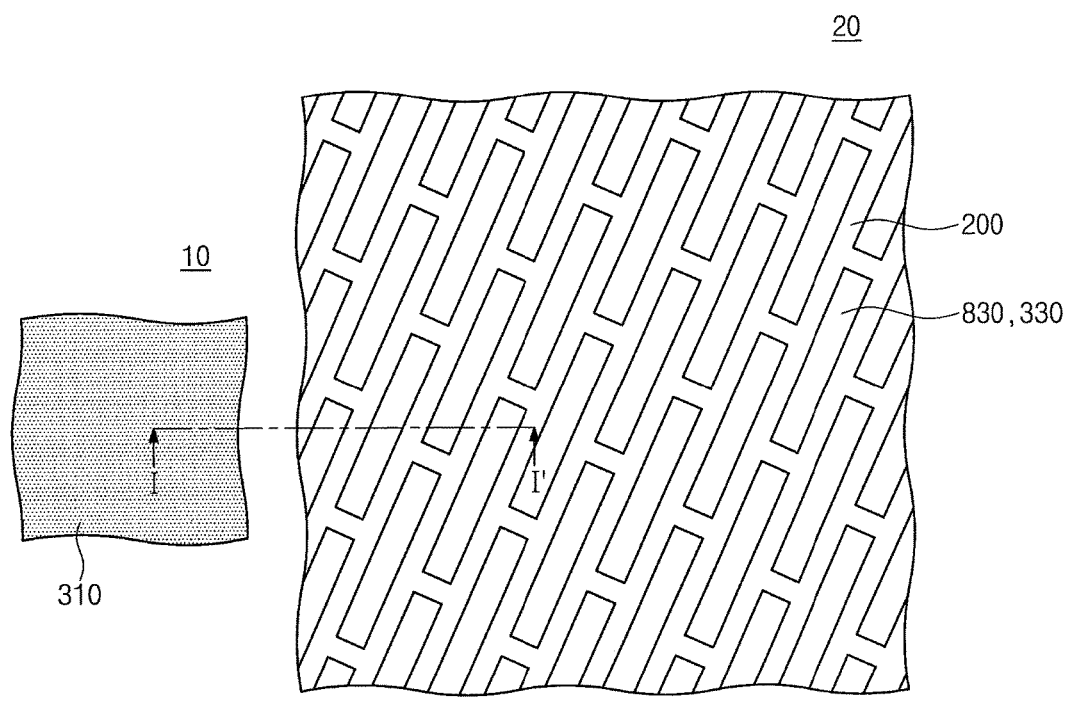

FIGS. 2A, 3A, and 4A illustrate plan views of a portion of the second region in the substrate, showing a method of fabricating a semiconductor device according to some embodiments of inventive concepts. FIGS. 2B, 3B, 4B, 5, and 6 illustrate cross-sectional views showing a method of fabricating a semiconductor device according to some embodiments of inventive concepts.

Referring to FIGS. 2A and 2B, a first mask layer 910 and a second mask layer 920 may be formed on the first and second regions 10 and 20 of the substrate 100. The first mask layer 910 may fill a space between neighboring first and second patterns 310 and 320 and spaces between neighboring second patterns 320, while on or covering the first pattern 310, the third spacer 810, and the fourth spacers 820. The first mask layer 910 may be or include, for example, a spin-on-hardmask (SOH) layer or an amorphous carbon layer (ACL).

The second mask layer 920 may be formed on the first mask layer 910. The second mask layer 920 may include openings OP. For example, the openings OP may be locally provided on the second region 20 of the substrate 100. The first mask layer 910 formed on the first region 10 of the substrate 100 may not be exposed to the openings OP, and the first mask layer 910 formed on the second region 20 of the substrate 100 may be partially exposed to the openings OP. For example, the openings OP may be disposed to vertically overlap the fourth spacers 820 and the second patterns 320. The second mask layer 920 may include, for example, a silicon oxide layer.

Referring to FIGS. 3A and 3B, an etching process may be performed to sequentially etch the first mask layer 910, the fourth spacers 820, and the second patterns 320 that are exposed to the openings OP. Therefore, one second pattern 320 may be divided into a plurality of third patterns 330, and one fourth spacer 820 may be divided into a plurality of fourth spacer patterns 830. The plurality of fourth spacer patterns 830 may be formed on top surfaces of the plurality of third patterns 330. The etching process may be a dry etching process.

Figure 4B:
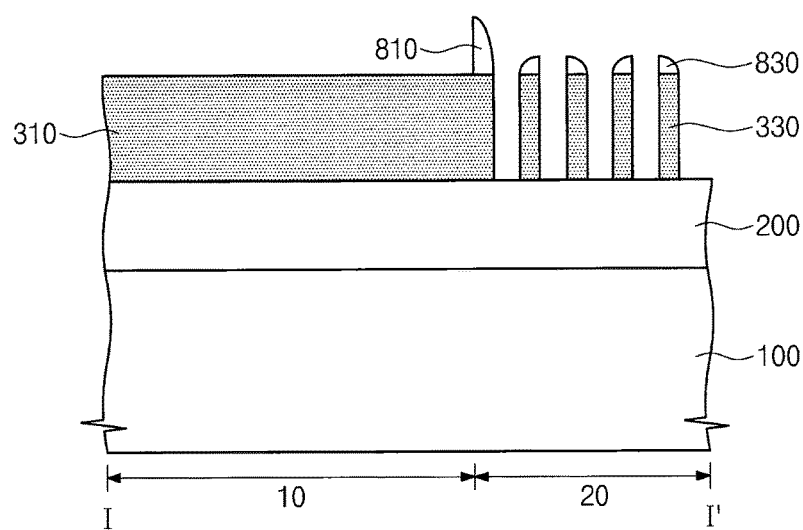

Referring to FIGS. 4A and 4B, the second and first mask layers 920 and 910 may be sequentially removed. The removal of the first and second mask layers 910 and 920 may expose top and lateral/side surfaces of the first pattern 310, lateral or side surfaces of the third patterns 330, a surface of the third spacer 810, surfaces of the fourth spacer patterns 830, and portions of a top surface of the first layer 200. The first and second mask layers 910 and 920 may be removed by a dry etching process and/or an ashing process.

Figure 5:
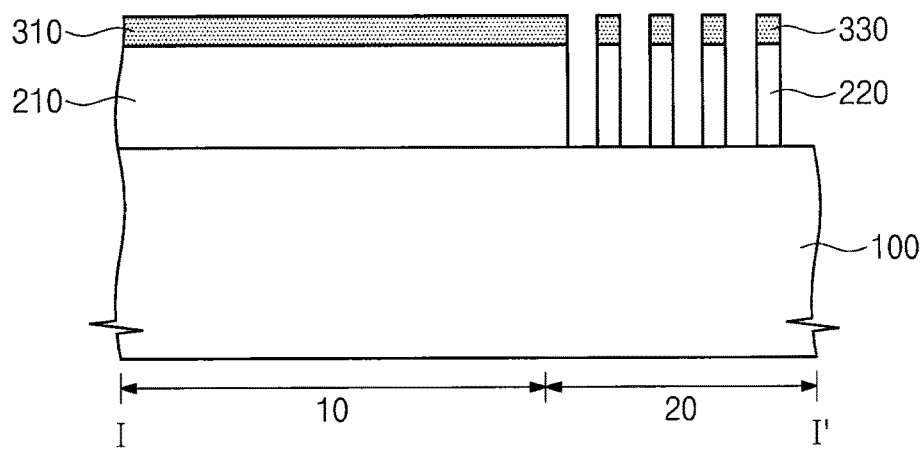

Referring to FIG. 5, the first layer 200 may be etched on its portions exposed through the first and third patterns 310 and 330, and thus a fourth pattern 210 and fifth patterns 220 may be formed. An etching process may be performed to remove the third spacer 810 and the fourth spacer patterns 830. The fourth pattern 210 may be provided thereon with the first pattern 310 whose thickness is reduced by the etching process, and the fifth patterns 220 may be provided thereon with the third patterns 330 whose thicknesses are reduced by the etching process. The etching process may be a dry etching process.

Figure 6:
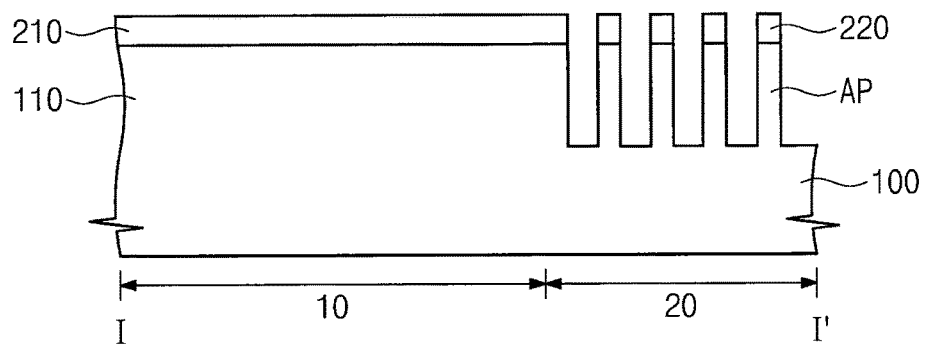

Referring to FIG. 6, an etching process may be performed portions of the substrate 100 that are exposed through the first, third, fourth, and fifth patterns 310, 330, 210, and 220, thereby forming a sixth pattern 110 and active patterns AP. The etching process may partially etch portions of the substrate 100 that are exposed through the fourth and fifth patterns 210 and 220. The sixth pattern 110 and the active patterns AP may then protrude from the etched top surface of the substrate 100. The sixth pattern 110 may be provided thereon with the fourth pattern 210 whose thickness is reduced by the etching process, and the active patterns AP may be provided thereon with the fifth patterns 220 whose thicknesses are reduced by the etching process. The etching process may be a dry etching process.

According to some embodiments of inventive concepts, one sacrificial layer may be used to perform a double patterning process twice, and thus manufacturing processes may become more simplified.

Although the present invention has been described in connection with the embodiments of inventive concepts illustrated in the accompanying drawings, it will be understood to those skilled in the art that various changes and modifications may be made without departing from the technical spirit and essential feature of inventive concepts. It will be apparent to those skilled in the art that various substitution, modifications, and changes may be thereto without departing from the scope and spirit of the inventive concepts.

What is claimed is:

1. A method of fabricating a semiconductor device, the method comprising:
    forming a lower layer on a substrate;
    forming, on the lower layer, a sacrificial layer and an etching pattern, wherein the sacrificial layer comprises a protrusion that protrudes from a top surface of the sacrificial layer, and wherein the etching pattern is on the protrusion;
    forming a first spacer layer on the sacrificial layer and the etching pattern;
    etching the sacrificial layer and the first spacer layer to form a sacrificial pattern and a first spacer on at least a portion of a top surface of the sacrificial pattern;
    forming a second spacer layer on the sacrificial pattern and the first spacer;
    etching the second spacer layer and the first spacer to form a second spacer on a sidewall of the sacrificial pattern, wherein the second spacer layer and the first spacer are etched until the at least the portion of the top surface of the sacrificial pattern is exposed; and
    etching the lower layer to form a pattern, while using the second spacer as an etching mask.

2. The method of claim 1, wherein the etching pattern is removed when the sacrificial layer and the first spacer layer are etched.

3. The method of claim 1, wherein the second spacer remains on a top surface of the pattern formed by the etching the lower layer.

4. The method of claim 1, further comprising: removing the sacrificial pattern before the etching the lower layer.

5. A method of fabricating a semiconductor device, the method comprising:
    forming a sacrificial layer, a first etching pattern, and a second etching pattern on a substrate including a first region and a second region,
        wherein the sacrificial layer comprises:
        a first protrusion that is on the first region and protrudes from a top surface of the sacrificial layer; and
        a second protrusion that is on the second region,
        the first etching pattern being on the first protrusion and the second etching pattern being on the second protrusion;
    forming a first spacer layer on the sacrificial layer, the first etching pattern, and the second etching pattern; and
    etching the first spacer layer and the sacrificial layer to form a first sacrificial pattern and a first spacer on the first region of the substrate and to form a second sacrificial pattern and a second spacer on the second region of the substrate;
    wherein the first etching pattern is on a top surface of the first sacrificial pattern after the etching,
    wherein the second spacer is formed on a top surface of the second sacrificial pattern, and
    wherein a top surface of the first etching pattern is located at a different level from that of a top surface of the second spacer.

6. The method of claim 5, wherein the top surface of the first etching pattern is at a higher level than the top surface of the second spacer.

7. The method of claim 5,
    wherein the first sacrificial pattern comprises a first segment and a second segment on the first segment, and
    wherein a width of the first segment is greater than a width of the second segment.

8. The method of claim 7, wherein
    the first spacer is formed on a side surface of the first etching pattern, a side surface of the second segment, and a top surface of the first segment, and
    a side surface of the first segment is exposed through the first spacer.

9. The method of claim 7,
    wherein a top surface of the second segment is at a higher level than the top surface of the second sacrificial pattern, and
    wherein a top surface of the first segment is coplanar with the top surface of the second sacrificial pattern.

10. The method of claim 5, further comprising:
    forming a first layer on the substrate, the first layer exhibiting etch selectivity to the substrate; and
    forming a second layer on the substrate, the second layer exhibiting etch selectivity to the first layer and exhibiting etch selectivity to the second sacrificial pattern,
    wherein the second spacer is spaced apart from the second layer.

11. The method of claim 5, further comprising:
    before etching the first spacer layer and the sacrificial layer, forming a mask pattern on the first region of the substrate to expose a portion of the sacrificial layer that is on the second region of the substrate and to expose a portion of the first spacer layer that is on a sidewall of the first protrusion,
    wherein the mask pattern is used as an etching mask to etch the first spacer layer and the sacrificial layer, and
    wherein the mask pattern is removed by being etched simultaneously with the first spacer layer and the sacrificial layer.

12. The method of claim 5, wherein the first region comprises a peripheral circuit zone, and the second region comprises a cell zone.

13. The method of claim 5,
    wherein a thickness of the second sacrificial pattern is equal to a thickness between the top surface of the sacrificial layer and a bottom surface of the sacrificial layer, and
    wherein the top surface of the sacrificial layer is exposed through the first and second etching patterns.

14. The method of claim 5,
    wherein the second etching pattern is removed by being etched simultaneously with the etching of the first spacer layer and the sacrificial layer, and
    wherein the first spacer is formed on side surfaces of the first sacrificial pattern and the first etching pattern.

15. The method of claim 14, further comprising:
    forming a lower layer between the substrate and the sacrificial layer,
    wherein, after etching the first spacer layer and the sacrificial layer, a top surface of the lower layer is partially exposed through the first sacrificial pattern and the second sacrificial pattern.

16. The method of claim 15, after etching the first spacer layer and the sacrificial layer, the method further comprising:

forming a second spacer layer on the first etching pattern, the first spacer, the second spacer, the second etching pattern, and a portion of the top surface of the lower layer;

etching the second spacer layer and the second spacer to form a third spacer on a side surface of the first spacer and to form a fourth spacer on a side surface of the second sacrificial pattern, wherein the second spacer layer and the second spacer are etched to expose the top surface of the second sacrificial pattern, a portion of the top surface of the lower layer, and the top surface of the first etching pattern;

removing the second sacrificial pattern; and etching the lower layer to form a first pattern on the first region of the substrate and to form a second pattern on the second region of the substrate, wherein the first etching pattern, the first sacrificial pattern, the first spacer, the third spacer, and the fourth spacer are used as an etching mask to etch the lower layer.

17. The method of claim 16, wherein the first spacer is removed during the etching the lower layer, wherein the third spacer and the first sacrificial pattern are on the first pattern after the etching the lower layer, and wherein the fourth spacer is on the second pattern after the etching the lower layer.

18. A method of fabricating a semiconductor device, the method comprising:

forming a sacrificial layer, a first etching pattern, and a second etching pattern on a substrate including a first region and a second region, wherein the sacrificial layer comprises:
a first protrusion that is on the first region and protrudes from a top surface of the sacrificial layer; and
a second protrusion that is on the second region,
the first etching pattern being on the first protrusion and the second etching pattern being on the second protrusion;

forming a first spacer layer on the sacrificial layer, the first etching pattern, and the second etching pattern; and etching the first spacer layer and the sacrificial layer to form a first sacrificial pattern and a first spacer on the first region of the substrate and to form a second sacrificial pattern and a second spacer on the second region of the substrate, wherein the first spacer is formed on a side surface of the first sacrificial pattern, and wherein the second spacer is formed on a top surface of the second sacrificial pattern.

19. The method of claim 18, wherein after etching the first spacer layer and the sacrificial layer, the first etching pattern remains on a top surface of the first sacrificial pattern, and wherein the second etching pattern is removed by being etched simultaneously when the first spacer layer and the sacrificial layer are etched.

20. The method of claim 19, wherein the first spacer is on a side surface of the first etching pattern and exposes a top surface of the first etching pattern.

* * * * *